US009787263B2

(12) United States Patent
Patel et al.

(10) Patent No.: US 9,787,263 B2
(45) Date of Patent: Oct. 10, 2017

(54) MISMATCH CORRECTION IN DIFFERENTIAL AMPLIFIERS USING ANALOG FLOATING GATE TRANSISTORS

(71) Applicant: Texas Instruments Incorporated, Dallas, TX (US)

(72) Inventors: Ujas Natvarlal Patel, Richardson, TX (US); Andrew Marshall, Dallas, TX (US); Harvey J. Stiegler, Plano, TX (US); Keith M. Jarreau, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/173,217

(22) Filed: Jun. 3, 2016

(65) Prior Publication Data
US 2017/0149395 A1 May 25, 2017

Related U.S. Application Data

(60) Provisional application No. 62/258,893, filed on Nov. 23, 2015.

(51) Int. Cl.
*H03F 3/45* (2006.01)
*H03F 1/02* (2006.01)

(52) U.S. Cl.
CPC ....... *H03F 3/45273* (2013.01); *H03F 1/0205* (2013.01); *H03F 3/45* (2013.01);
(Continued)

(58) Field of Classification Search
CPC ...... H03F 3/45273; H03F 1/0205; H03F 3/45; H03F 3/45179; H03F 3/45183; H03F 3/45188; H03F 3/45174; H03F 3/45372
(Continued)

(56) References Cited

U.S. PATENT DOCUMENTS 6,870,425 B2 *  3/2005  Leifso ................. H03F 3/45085
                                                330/254
6,943,618 B1 *  9/2005  Tanji .................... H03F 3/45479
                                                327/539
(Continued)

OTHER PUBLICATIONS

Carley, "Trimming Analog Circuits Using Floating-Gate Analog MOS Memory", J. Solid State Circ., vol. 24, No. 6 (IEEE, 1989), pp. 1569-1575.
(Continued)

*Primary Examiner* — Khanh V Nguyen
(74) *Attorney, Agent, or Firm* — Kenneth Liu; Charles A. Brill; Frank D. Cimino (57) ABSTRACT

An analog differential amplifier circuit, such as an operational transconductance amplifier (OTA), with input offset correction capability. First and second analog floating gate (AFG) devices each include a trim transistor connected in parallel with a series transistor in first and second input legs, respectively, of the amplifier. Floating gate electrodes in the AFG devices are differentially programmed to correct for error in the output signal in response to zero input differential voltage at its inputs. Temperature stability is attained by programming the floating gate electrodes to gate voltages above the floating gate transistors. In one embodiment, the AFG devices each include a second trim transistor sharing the same floating gate electrode; the sum of the currents conducted by the second trim transistors is added, by way of a current mirror, to the tail current applied to the first and second input legs.

21 Claims, 5 Drawing Sheets

(52) U.S. Cl.
CPC ............... *H03F 3/45179* (2013.01); *H03F 2003/45017* (2013.01); *H03F 2200/375* (2013.01); *H03F 2203/45121* (2013.01)

(58) Field of Classification Search
USPC ........................................................ 330/253
See application file for complete search history.

(56) References Cited

U.S. PATENT DOCUMENTS

| | | | | |
|---|---|---|---|---|
| 7,034,566 | B2* | 4/2006 | Cranford, Jr. .. | H03K 19/018585 326/21 |
| 7,403,071 | B2* | 7/2008 | Hollenbeck ............. | H03F 3/191 330/254 |
| 7,642,852 | B2* | 1/2010 | Chandra ............. | H03F 3/45183 330/258 |
| 8,593,846 | B2 | 11/2013 | Helsley et al. | |
| 8,779,550 | B2 | 7/2014 | Liu et al. | |
| 9,094,244 | B2* | 7/2015 | Hwang ............... | H04L 25/0272 |
| 2005/0231275 | A1 | 10/2005 | Wang | |
| 2005/0248396 | A1* | 11/2005 | Caresosa ............. | H03F 3/45188 327/563 |
| 2007/0024377 | A1* | 2/2007 | Wang ................. | H03F 1/42 330/305 |
| 2009/0108936 | A1 | 4/2009 | Forejt | |
| 2010/0176879 | A1 | 7/2010 | Hasler et al. | |
| 2015/0319020 | A1* | 11/2015 | Song .................. | H04L 25/03 345/204 |
| 2015/0364480 | A1 | 12/2015 | Mitchell | |

OTHER PUBLICATIONS

Sackinger et al., "An Analog Trimming Circuit Based on a Floating-Gate Device", J. Solid State Circ., vol. 23, No. 6 (IEEE, 1988), pp. 1437-1440.

Yang et al., "The multiple input floating gate MOS differential amplifier: an analog computational building-block," Proc. IEEE Int'l Symp. Circuits and Systems, vol. 5 (IEEE, 1994), pp. 37-40.

Enz et al., "Circuit Techniques for Reducing the Effects of Op-Amp Imperfections: Autozeroing, Correlated Double Sampling, and Chopper Stabilization", Proc. of the IEEE, vol. 84, No. 11 (IEEE, 1996), pp. 1584-1614.

Negut et al., "Analog Floating Gate Approach for Programmable Current Mirrors and Current Sources", Proc. of International Semiconductor Conference (CAS), (IEEE, 2010), pp. 525-528.

Geiger et al., "Active Filter Design Using Operational Transconductance Amplifiers: A Tutorial", Circuits and Devices Magazine (IEEE, Mar. 1985), pp. 20-32.

Kapur et al., "Analog Field Programmable CMOS Operational Transconductance Amplifier (OTA)", Int'l Conf. on Emerging Trends and Applications in Computer Science (ICETACS), (IEEE, 2013), pp. 172-177.

International Search Report and Written Opinion for PCT/US2016/063563 mailed Mar. 30, 2017.

\* cited by examiner

MISMATCH CORRECTION IN DIFFERENTIAL AMPLIFIERS USING ANALOG FLOATING GATE TRANSISTORS

CROSS-REFERENCE TO RELATED APPLICATIONS

This application claims priority, under 35 U.S.C. §119(e), of Provisional Application No. 62/258,893, filed Nov. 23, 2015, incorporated herein by this reference.

STATEMENT REGARDING FEDERALLY SPONSORED RESEARCH OR DEVELOPMENT

Not applicable.

BACKGROUND OF THE INVENTION

This invention is in the field of analog circuits. More specifically, embodiments are directed to the correction of mismatch in analog circuits realized in an integrated circuit device.

Metal-oxide semiconductor (MOS) technology has become an attractive vehicle for implementing analog circuits in recent years. For example, the continuing trend toward large-scale integration has extended to "mixed-signal" integrated circuits, motivating the use of a single technology for both the digital and the analog functions in the same device. MOS analog circuits, such as operational transconductance amplifiers (OTAs), can attain significantly improved bandwidths and reduced power consumption over their bipolar counterparts, especially when realized in complementary MOS (CMOS) technology.

Figure 1:
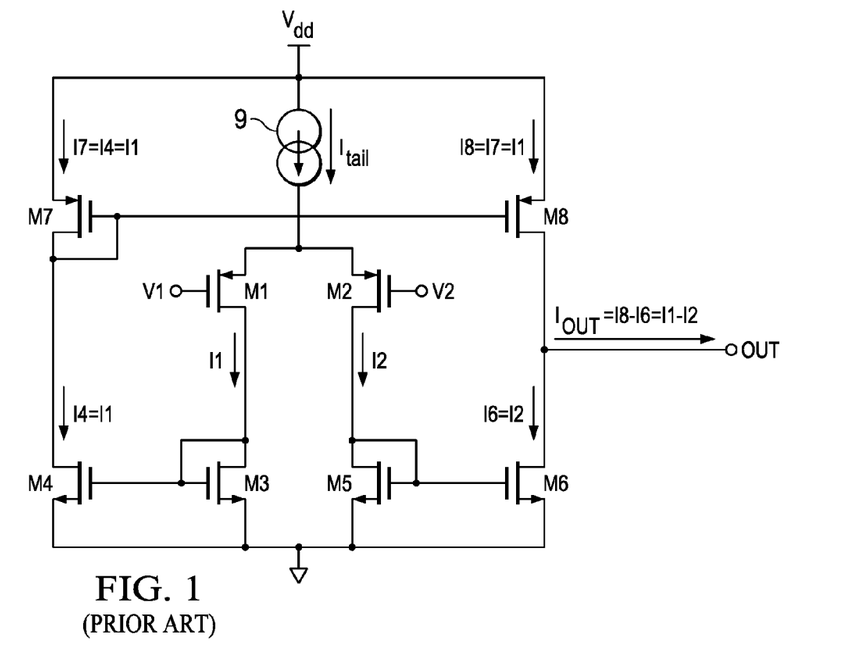
FIG. 1 is an electrical diagram, in schematic form, of a conventional operational transconductance amplifier (OTA).

FIG. 1 illustrates an example of a conventional MOS OTA. Current source 9, for example a p-channel MOS transistor with its source at the $V_{dd}$ power supply voltage and its gate receiving a regulated voltage, applies tail current $I_{tail}$ to the sources of input p-channel MOS transistors M1, M2, which receive input voltages V1, V2, respectively, at their gates. Transistors M1 and M2 are each connected in series with diode-connected n-channel MOS transistors M3 and M5, respectively. The gate and drain of transistor M3 is connected to the gate of n-channel MOS transistor M4 in current mirror fashion, and the gate and drain of transistor M2 is likewise connected to the gate of n-channel MOS transistor M6 in the output leg. The source/drain path of transistor M4 is connected in series with diode-connected p-channel MOS transistor M7, which has its gate and drain connected in current mirror fashion with the gate of p-channel MOS transistor M8 in the output leg. As such, three current mirrors (M3 and M4; M5 and M6; and M7 and M8) are present in this conventional MOS OTA.

In operation, with all transistors in saturation, the differential input voltage V1-V2 determines the split of tail current $I_{tail}$ into currents I1, I2 conducted by transistors M1, M2, respectively. Current I1 conducted by transistor M3 is mirrored as current I4 through transistor M4, and similarly current I2 is mirrored as current I6 through transistor M6. Current I7 conducted by transistor M7 is equal to current I4, and thus current I1; this current is mirrored as current I8 through transistor M8. Accordingly, current I8 into terminal OUT is equal to current I1 through transistor M1, based on input voltage V1, while current I6 out of terminal OUT is equal to current I2 through transistor M2, which is based on input voltage V2. Output current IOUT from this OTA is thus the current difference I8-I6, which is defined by the differential input voltage V1-V2.

However, mismatch between MOS transistors raises a serious challenge in analog circuits, particularly in differential amplifiers and OTAs such as that of FIG. 1. As known in the art, mismatch between MOS transistors can result from differences in the layout and position of the transistors in the integrated circuit, and from random variations in wafer fabrication processes that affect individual transistors differently. If, for example, all transistors in the OTA of FIG. 1 are well-matched, a zero input differential voltage V1-V2 will result in a zero output current IOUT, since transistors M1, M2 will evenly split tail current $I_{tail}$ into equal currents I1 and I2. Mismatch between transistors M1 and M2, on the other hand, will cause an unequal split of tail current $I_{tail}$ at zero input differential voltage, and the resulting difference between currents I1 and I2 will be reflected by a non-zero output current IOUT. The primary effect of device mismatch in differential input OTAs is thus a non-zero input offset voltage, and corresponding error in the output current.

Conventional circuit techniques for reducing offset include auto-zeroing techniques, correlated double sampling, chopper stabilization, and the like. According to another approach, many analog integrated circuits can now be "trimmed", for example to reduce the input offset voltage of the op amp. Trimming is typically performed at manufacture, after electrical measurement or other evaluation of the performance of the raw circuit as manufactured. Conventional digital trimming is accomplished by selectively opening one or more fuses (or closing antifuses), by laser trimming of resistors. Another conventional approach to trimming analog circuits is digital programming of floating gate metal-oxide-semiconductor (MOS) transistors, in which the state of the transistor is defined by charge trapped at a floating gate electrode. Programming of the device is accomplished through such mechanisms as Fowler-Nordheim tunneling and hot carrier injection. These floating gate transistors essentially function as an electrically-erasable programmable read-only memory (EEPROM) or "flash" memory in this digital trimming application.

By way of further background, various types of analog floating gate devices are known in the art. These analog floating gate devices are integrated circuit structures that include a transistor having a floating gate electrode that can be programmed (i.e., charged or discharged) to a precise analog voltage, rather than to either an on state or an off state to which floating gate transistors are typically programmed in digital memory such as EEPROMs or flash memory. Examples of the physical construction of analog floating gate devices are described in U.S. Pat. Nos. 8,593,846 and 8,779,550, and in U.S. Patent Application Publication No. US 2015/0364480, all commonly assigned herewith and incorporated herein by this reference.

BRIEF SUMMARY OF THE INVENTION

Disclosed embodiments provide an analog differential circuit and method in which input offset due to transistor mismatch is reduced.

Disclosed embodiments provide such a circuit and method that provides such reduced input offset over the operating temperature range.

Disclosed embodiments provide such a circuit and method that maintains excellent gain and phase performance over frequency.

Other objects and advantages of the disclosed embodiments will be apparent to those of ordinary skill in the art having reference to the following specification together with its drawings.

According to certain embodiments, a programmable resistive element, such as an analog floating gate device, is provided for each input leg of an analog metal-oxide semiconductor (MOS) differential circuit, such as an operational transconductance amplifier (OTA). Each input leg includes an input MOS transistor receiving an input voltage, in series with a diode-connected series transistor. In the case of an analog floating gate device, the device at each leg includes a floating gate transistor connected in parallel with the series transistor of that leg. The floating gates are differentially programmed to adjust the currents conducted by the input legs for mismatch between the input transistors, correcting those currents for input offset.

In some embodiments, the analog floating gate devices each include a second transistor also controlled by the floating gate. These second transistors are connected in parallel with one another, and in series with an input leg of a tail current mirror. A mirror leg of the tail current mirror adds current to a tail current applied to the input legs responsive to the programmed levels of the analog floating gate devices.

BRIEF DESCRIPTION OF THE SEVERAL VIEWS OF THE DRAWING

FIGS. 4b and 4c are plan and cross-sectional views, respectively, of the analog floating gate device of FIG. 4a.

DETAILED DESCRIPTION OF THE INVENTION

The one or more embodiments described in this specification are implemented into an operational transconductance amplifier (OTA) implemented in metal-oxide semiconductor (MOS) technology, as it is contemplated that such implementation is particularly advantageous in that context. However, it is also contemplated that concepts of this invention may be beneficially applied to other applications, for example other types of analog differential circuits, implemented in MOS or analogous transistor technologies. Accordingly, it is to be understood that the following description is provided by way of example only, and is not intended to limit the true scope of this invention as claimed.

Figure 2:
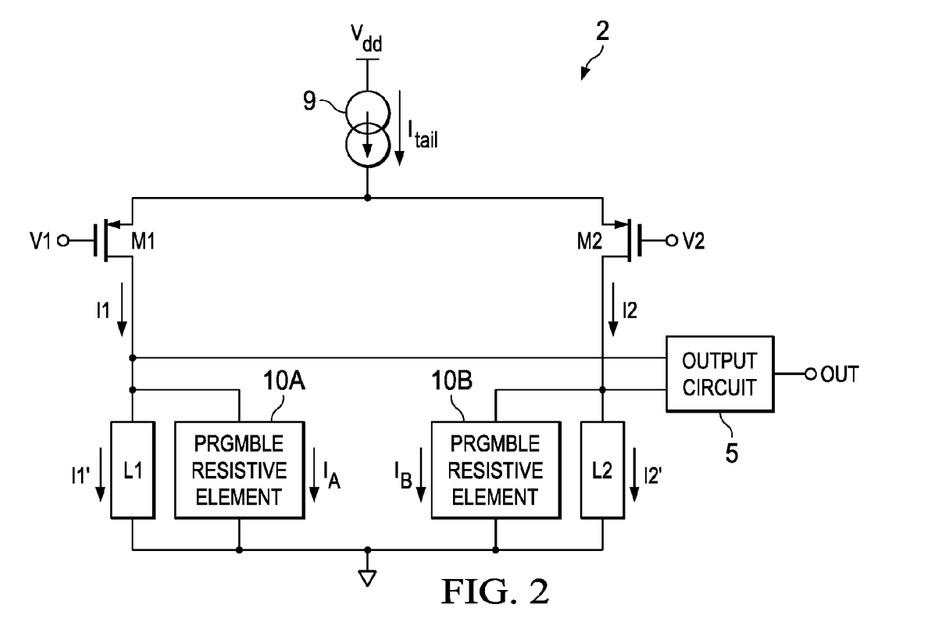
FIG. 2 is an electrical diagram, in schematic form, of an analog differential circuit constructed according to these embodiments.

FIG. 2 illustrates the generalized architecture of analog differential circuit 2 according to these embodiments. Similarly as the conventional OTA described above relative to FIG. 1, circuit 2 includes current source 9 that sources tail current $I_{tail}$ from the $V_{dd}$ power supply voltage to two input legs. One of the input legs includes p-channel MOS input transistor M1 and the other includes input p-channel MOS input transistor M2, the two transistors M1, M2 with their sources connected in common at current source 9. In this arrangement, input transistors M1 and M2 receive input voltages V1, V2, respectively, at their gates, and their drains coupled to ground via load devices L1, L2, respectively. As described above relative to FIG. 1 and as will be described below, load devices L1, L2 may be constructed as diode-connected MOS transistors; alternatively, load devices L1, L2 may be realized as resistors or another type of impedance, as suitable for the desired application. Output circuit 5 is coupled to the input legs in some fashion so as to respond to the split in currents conducted by input devices M1, M2, and to produce an output signal at terminal OUT accordingly. As shown in FIG. 2 by way of example, output circuit 5 is connected at a node in each of the input legs between input transistors M1, M2 and respective load devices L1, L2. Output circuit 5 generically represents a variety of output circuit types, one example of which is the current mirror arrangement described above relative to FIG. 1 and described in further detail below. Alternative implementations of output circuit 5 will be apparent to those skilled in the art having reference to this specification. In any case, with all transistors in saturation, the differential input voltage V1-V2 at the gates of input transistors M1, M2 will determine the split of tail current $I_{tail}$ into currents I1, I2 conducted by transistors M1, M2, respectively, in response to which output circuit 5 will produce a signal at terminal OUT.

According to these embodiments, programmable resistive elements 10A, 10B are connected in parallel with load devices L1, L2, respectively, between the drain of respective input transistors M1, M2 and ground. Programmable resistive elements 10A, 10B are devices that have programmable conductivity, examples of which include analog floating gate devices, laser trimmable resistors, devices referred to in the art as "memristors", spin memory devices, and the like. According to these embodiments, programmable resistive elements 10A, 10B are programmed to conduct trim currents $I_A$, $I_B$ in operation. These currents $I_A$, $I_B$, together with currents I1', I2' conducted by load devices L1, L2, constitute currents I1, I2, respectively, that are conducted by the input legs of circuit 2 in response to input voltages V1, V2.

As described above, with all transistors in saturation, the differential input voltage V1-V2 will determine the split of tail current $I_{tail}$ into currents I1, I2 in the two input legs of circuit 2. These currents I1, I2 will differ from one another according to the differential input voltage V1-V2, with that current difference reflected in the output signal produced by output circuit 5 at terminal OUT. As mentioned above, this output signal is ideally zero at zero differential input voltage V1-V2. But because of transistor mismatch in the integrated circuit, for example mismatch between input transistors M1 and M2, zero differential input voltage V1-V2 may not be reflected as a zero-valued output signal. This error is typically referred to as input offset, in that the transistor mismatch appears as though it is an offset in the differential input voltage V1-V2. According to these embodiments, programmable resistive elements 10A, 10B are differentially programmed to conduct trim currents $I_A$, $I_B$ to correct for differences between currents I1 and I2 caused by mismatch of input transistors M1 and M2 relative to one another, thus eliminating the input offset error.

Figure 3:
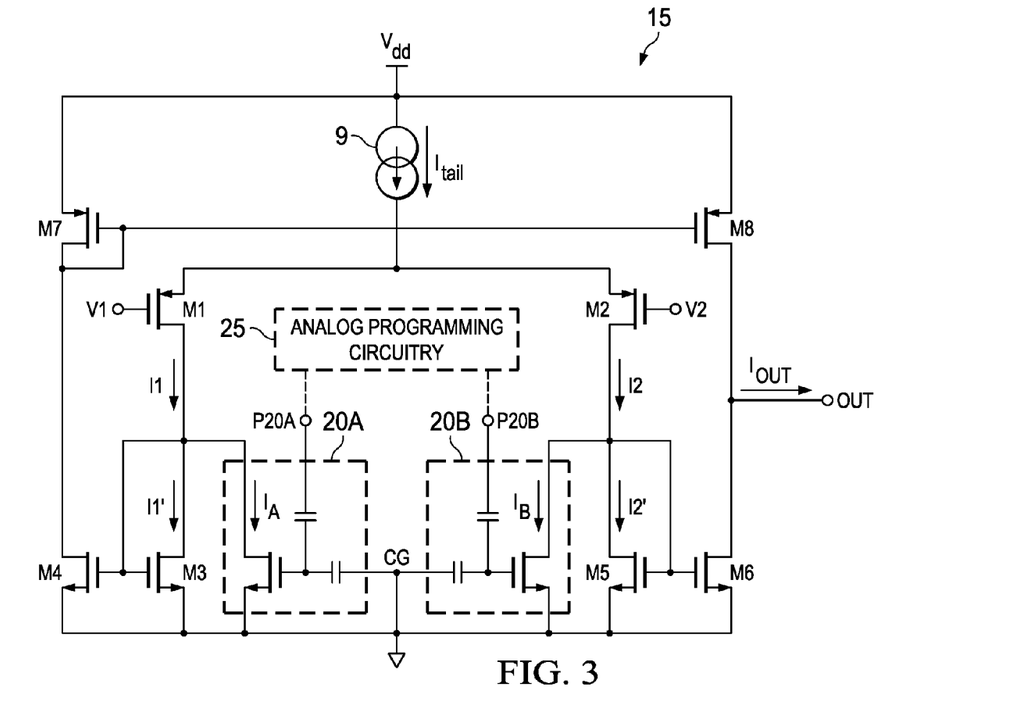
FIG. 3 is an electrical diagram, in schematic form, of an OTA constructed according to an embodiment.

FIG. 3 illustrates OTA 15 constructed according to an embodiment, specifically as a type of generalized analog differential circuit 2 of FIG. 2. In this embodiment, OTA 15 is constructed in a single integrated circuit, typically in combination with other circuit functions in a large-scale integrated circuit. A wide variety of applications are contemplated for integrated circuits including OTA 15 according to this embodiment, ranging from a stand-alone differential amplifier, to larger scale analog and mixed-signal (analog and digital) integrated circuits, and to very large scale integrated circuits such as microcontrollers and the so-called system on a chip (SoC) devices.

As evident from FIG. 3, OTA 15 is constructed similarly as the OTA described above relative to FIG. 1; the same reference numerals as used in FIGS. 1 and 2 will refer to like elements in OTA 15 of FIG. 3. As such, in this example, OTA 15 includes transistors M1 through M8 connected with one another in the same arrangement as described above relative to FIG. 1. In this embodiment, the mirror leg of transistors M4 and M7, and the output leg of transistors M6 and M8, serve the role of output circuit 5 in the generalized architecture of FIG. 2. More specifically, current I1 is mirrored by the mirror leg of transistors M4 and M7, and the current in this mirror leg is in turn mirrored by transistor M8 in the output leg of OTA 15. On the other hand, current I2 is mirrored at transistor M6 in the output leg. The currents conducted by transistors M6 and M8 will differ from one another according to the differential input voltage V1-V2, with that current difference reflected as output current $I_{OUT}$ at terminal OUT. In short, a combination of three current mirrors (M3 and M4; M5 and M6; and M7 and M8) in OTA 15 results in an output current $T_{OUT}$ at terminal OUT that reflects the differential input voltage V1-V2 (i.e., the gain of OTA 15 is a transconductance).

For purposes of this description, it will be assumed that transistors M1 through M8, and specifically the paired transistors in the current mirrors, are of the same size as one another, such that the mirrored currents are in a 1:1 ratio. Of course, the current mirrors may instead be ratioed, as known in the art, in which case the mirrored currents will scale accordingly.

According to this embodiment, programmable resistive elements 10A, 10B are realized in the form of analog floating gate (AFG) devices 20A, 20B. These AFG devices 20A, 20B can be differentially programmed to compensate for a difference between currents I1 and I2 due to mismatch of input transistors M1 and M2 relative to one another, eliminating input offset in OTA 15.

Figure 4A:
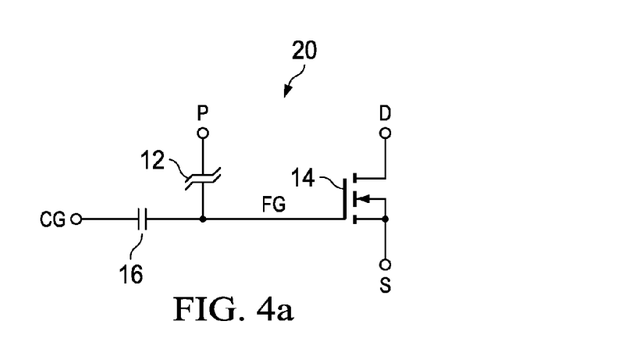
FIG. 4a is an electrical diagram, in schematic form, of an analog floating gate device implemented in the OTA of FIG. 3 according to that embodiment.

FIG. 4a electrically illustrates the arrangement of AFG device 20, as used to implement AFG devices 20A, 20B in OTA 15 according to this embodiment. In this example, AFG device 20 includes tunnel capacitor 12, n-channel MOS transistor 14, and control capacitor 16. An electrically floating gate electrode FG serves as a plate of tunnel capacitor 12 and of control capacitor 16, and also as the gate of transistor 14. Control gate terminal CG is at a second plate of control capacitor 16, and programming terminal P is at a second plate of tunnel capacitor 12. Typically, floating gate electrode FG is a single dielectrically-insulated polysilicon element overlying a channel region of transistor 14 and also defining a plate of each of capacitors 12, 16.

Figure 4B:
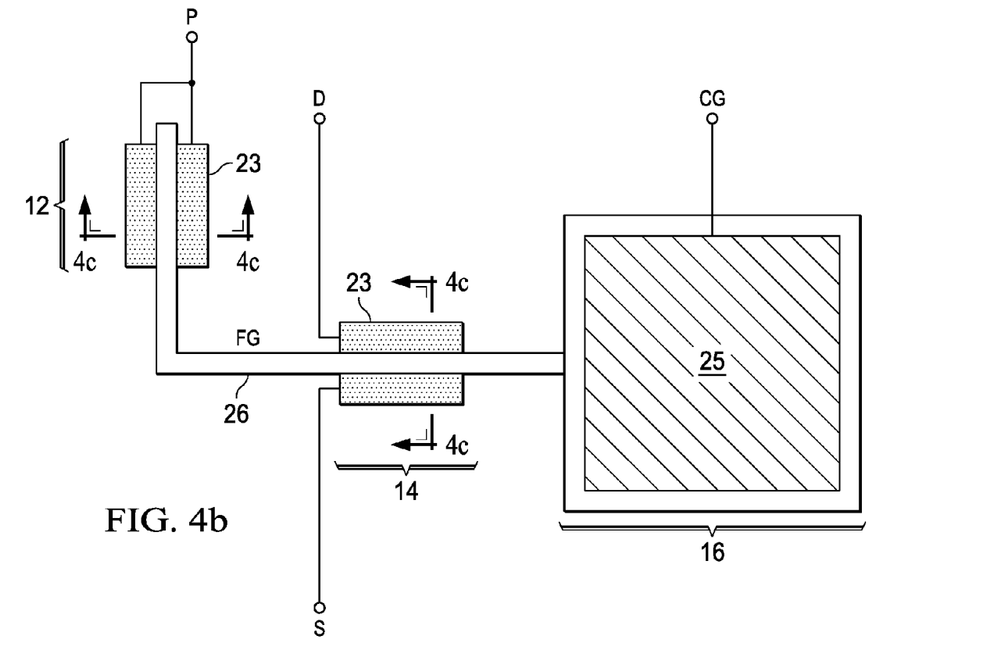
Figure 4C:
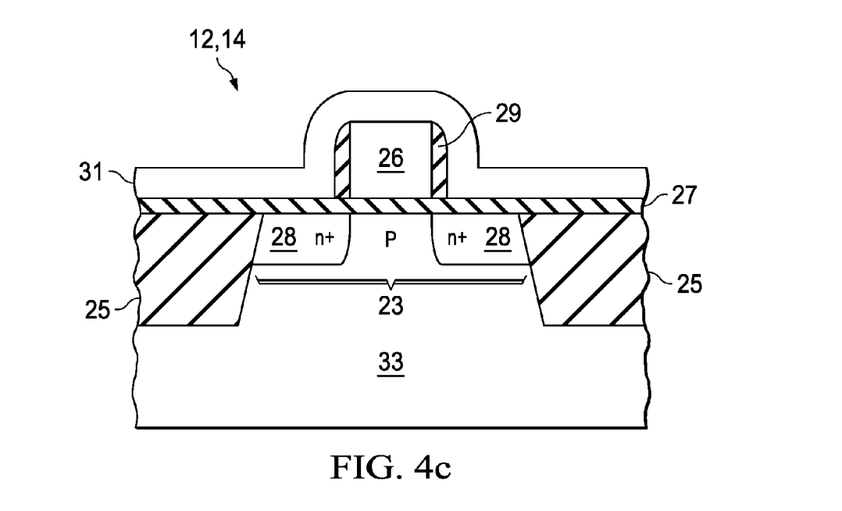

FIGS. 4b and 4c illustrate, in plan and cross-sectional views, respectively, the construction of an example of AFG device 20 according to the arrangement of the above-incorporated U.S. Pat. No. 8,779,550. Floating gate electrode FG is constructed of polycrystalline silicon (polysilicon) element 28, which extends over the surface of a semiconductor wafer (or over a semiconductor surface layer, in the silicon-on-insulator context), shown in FIG. 4c as p-type substrate 33 in this example; this substrate 33 may be a doped well region of the semiconductor, if desired. Poly-silicon element 26 is typically doped to a desired conductivity type and concentration so as to be conductive; this doping is typically n-type for the case of n-channel MOS transistor 14. Polysilicon element 26 has a widened portion at one end, serving as a lower plate of control capacitor 16. In this example, control capacitor 16 is a metal-to-polysilicon capacitor, in which case the upper plate 25 is formed of a patterned metal or conductive metal compound (e.g., tantalum nitride) element that overlies the widened portion of polysilicon element 26 at this location. Upper plate 25 is directly or indirectly connected to control gate CG, for example by way of an overlying metal conductor and contact to upper plate 25.

FIG. 4c illustrates the construction of transistor 14 and tunnel capacitor 12 of this example in cross-section. In the conventional manner, active regions 23 are regions at the surface of the semiconductor at which isolation dielectric structures 25 are not present. The portion of polysilicon element 26 overlying each active region 23 defines a gate electrode of an n-channel MOS transistor, with gate dielectric 27 disposed between polysilicon electrode 26 and the surface of active region 23, as shown in FIG. 4c. Dielectric layer 31 disposed over gate electrode 26 also serves as the capacitor dielectric of metal-to-poly control capacitor 16. Heavily-doped n-type source/drain regions 28 are formed into p-type substrate 33, on opposite sides of polysilicon element 26 in the conventional self-aligned fashion. Sidewall nitride elements 29, on the sidewalls of polysilicon element 26, space the heavily doped source/drain implant from the edges of the gate; in the conventional manner, lightly-doped source/drain extensions may be present under sidewall nitride elements 29, having been implanted before the formation of that film. In transistor 14, source/drain regions 28 are connected to source S and drain D nodes in the conventional manner, typically by a contact (not shown) to portions of those regions by metal conductors, such that the source and drain nodes of transistor 14 can be connected in the desired circuit arrangement. In the case of tunnel capacitor 12, however, its source/drain regions are typically connected in common with one another at programming node P, which is directly or indirectly contacted by an overlying conductor.

The relatively thin capacitor dielectric of tunnel capacitor 12, namely gate dielectric 27, allows mechanisms such as Fowler-Nordheim tunneling to transfer charge between source/drain regions 28 to polysilicon element 26 under the appropriate bias at programming node P. Typically, this programming is performed by applying a series of pulses of an appropriate positive voltage to node P relative to the voltage at control gate CG (e.g., held to ground). These pulses will remove electrons from floating gate electrode FG, leaving floating gate electrode FG positively charged. This positive charge results in effectively a lower threshold voltage, from the standpoint of the voltage at control gate CG, facilitating conduction through transistor 14. Conversely, electrons may be added to floating gate electrode FG by applying pulses of a negative voltage to node P relative to the voltage at control gate CG (e.g., at ground); these additional electrons will increase the effective threshold voltage of transistor 14, again from the standpoint of the control gate voltage. Some conventional analog floating gate devices include two tunneling capacitors, one used for adding electrons to the floating gate and the other for removing electrons from the floating gate. In either case, in this analog context, the duration and magnitude of the pulses can be adjusted to precisely set the charge state at floating gate electrode FG, and thus set the current conducted by transistor 14 in response to a voltage at control gate CG.

As mentioned above relative to FIG. 1, alternative approaches to the construction of floating gate devices generally, and of analog floating gate devices in particular, may alternatively be used to realize AFG devices 20A, 20B in this embodiment. Further in the alternative, other types of programmable resistive elements besides analog floating gate devices (e.g., laser trimmable resistors, devices referred to in the art as "memristors", spin memory devices, and the like) may be used in connection with these embodiments. It is contemplated that those skilled in the art having reference to this specification will be readily able to select the appropriate construction for AFG devices 20A, 20B or other programmable resistive devices as best suited for a particular application and fabrication technology, without undue experimentation.

Referring back to FIG. 3, AFG device 20A is implemented so that its n-channel transistor 14 has its source/drain path connected in parallel with the source/drain path of series transistor M3 in one input leg of OTA 15, and AFG device 20B is implemented so that its transistor 14 similarly has its source/drain path in parallel with that of series transistor M5 in the other input leg. Control gates CG of AFG devices 20A, 20B are both connected to ground, while programming nodes P20A, P20B of AFG devices 20A, 20B, respectively, are separately accessible to analog programming circuitry 25. According to this embodiment, analog programming circuitry 25 may be realized either external to the integrated circuit in which OTA 15 is realized, for example as part of automated test equipment, or internal to that integrated circuit, for example as part of built-in self-test or other diagnostic circuitry, or as part of the voltage regulation circuitry of the integrated circuit. In either case, analog programming circuitry 25 may be constructed as conventional in the art, typically with the appropriate logic and control circuitry to apply the appropriate programming pulses at the appropriate voltages to programming nodes P20A, P20B of OTA 15 to carry out the desired programming.

With control gates CG at ground, the gate voltages to which floating gates FG of AFG devices 20A, 20B are programmed will determine the extent to which their respective transistors 14 are conductive, in the analog sense. More specifically, referring to AFG device 20 as shown in FIG. 4a and assuming that control gate CG is at ground as in the implementation of FIG. 3, the gate to source voltage of transistor 14 will be determined solely by the trapped charge on floating gate FG, and thus the source/drain conduction of transistor 14 under bias will be determined by the relationship of this programmed gate voltage of floating gate electrode FG to the threshold voltage of transistor 14. For purposes of this description, this threshold voltage of transistor 14 refers to its "native" threshold voltage, as distinct from its "apparent" threshold voltage from the viewpoint of an applied control gate voltage considering the programmed charge at the floating gate.

Accordingly, transistors 14 of AFG devices 20A and 20B can be programmed to conduct currents $I_A$, $I_B$, respectively, from their respective input leg currents I1, I2. These currents $I_A$, $I_B$ can be set so as to "trim" the operation of OTA 15 by adjusting the currents I1', I2' conducted by transistors M3, M5, respectively, that establish output current $I_{OUT}$. According to this embodiment of the invention, therefore, analog programming circuitry 25 will program AFG devices 20A, 20B so that their respective trim transistor currents $I_A$, $I_B$ relative to one another compensate for any difference in currents I1, I2 due to mismatch of input transistors M1, M2. For example, if current I1 is greater than current I2 with equal input voltages V1=V2, the gate voltages of AFG devices 20A, 20B may be programmed so that current $I_A$ conducted by AFG device 20A is greater than current $I_B$ conducted by AFG device 20B, by an amount corresponding to the difference in currents I1, I2 under zero differential input voltage V1-V2. In this programmed condition, current IF conducted by transistor M3 will equal current I2' conducted by transistor M5 under zero differential input voltage V1-V2. Because currents I1', I2' are mirrored in the output leg of OTA 15 and currents $I_A$ and $I_B$ are not, output current $I_{OUT}$ at terminal OUT will be zero under zero differential input voltage. Input offset due to transistor mismatch is thus corrected.

It is contemplated that OTA 15 may be trimmed by the programming of AFG devices 20A, 20B as part of a test process or routine, for example as part of a manufacturing test flow or as part of a power-on self-test routine. An embodiment of this trimming process will now be described. At the beginning of the trim operation, AFG devices 20A, 20B may optionally be "erased" or otherwise set to a known "off" state (i.e., at gate voltages below the threshold voltages of trim transistors 14), such that current $I_A=I_B=0$. With OTA 15 biased from the $V_{dd}$ power supply voltage, equal input voltages V1, V2 are then applied to the gates of input transistors M1, M2, and output current $I_{OUT}$ is measured, for example by automated test equipment carrying out the test and programming routine, or by downstream circuitry internal to the integrated circuit that receives output current $I_{OUT}$. In either case, the measured output current $I_{OUT}$ under this zero differential input voltage condition is fed back to analog programming circuitry 25, which in turn differentially programs AFG devices 20A, 20B according to the polarity and magnitude of the measured output current $I_{OUT}$. As noted above, this programming may involve either or both trapping and removing electrons onto or from floating gate electrodes FG, as the case may be. Following the desired programming of AFG devices 20A, 20B, output current $I_{OUT}$ under zero differential input voltage may again be measured, and the programming operation repeated as necessary to correct for input offset to the desired level of precision.

Those skilled in the art having reference to this specification will recognize that the differential programming performed according to this embodiment may be performed by programming only one of AFG devices 20A, 20B, leaving the other in its "off" state. In other words, one of currents $I_A$, $I_B$ may be programmed to fully compensate for the input offset, while the other remains at zero. However, it has been observed that this programming of a single AFG device 20A, 20B will often result in the programmed gate voltage being near or slightly below the threshold voltage of its transistor, particularly when the input offset being compensated is relatively mild. It has been further observed, according to this invention, that this low level of programming results in offset correction that is quite sensitive to temperature over typical operating temperatures for modern integrated circuits (e.g., 0° to 125° C.).

It is therefore contemplated, according to these embodiments, that it will generally be desirable to program both of AFG devices 20A, 20B to gate voltages that are above the threshold voltages of their trim transistors 14, with a differential between the programmed gate voltages providing a differential in the currents $I_A$, $I_B$ that corrects for input offset as described above. For example, it has been observed that by programming the gate voltages of AFG devices 20A, 20B to gate voltages at least 0.1 volts above the threshold voltages of their trim transistors 14, the input offset correction provided by this embodiment will have a low temperature coefficient, and will exhibit good temperature stability over a reasonable temperature range.

It has been further observed, according to this invention, that some nonlinearity in the operation of an OTA constructed according to the embodiment of FIG. 3 can still occur in some situations, especially at higher temperatures and when correcting for large offset. It is believed that this observed nonlinearity is due to the shunting of enough current by trim transistors 14 (as currents $I_A$, $I_B$) that the remaining currents (I1', I2') are insufficient to properly drive the mirror and output legs of the OTA. This nonlinearity may be addressed by increasing the tail current $I_{tail}$ sourced by current source 9, to ensure that currents I1', I2' are sufficiently high, even for circuits with high input offset and at high temperature.

However, it is contemplated that, in many instances, the input offset will not be so large that additional tail current is necessary to avoid this high temperature nonlinearity. In those cases, the additional tail current will simply cause excess power consumption with no benefit in correction. According to another embodiment, therefore, an OTA is constructed in which the currents supplied to the input legs can adapt to the programmed level of the AFG devices, and thus avoid nonlinearity while minimizing power consumption.

Figure 5:
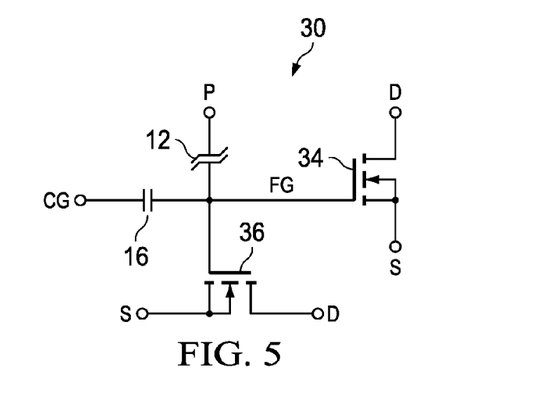
FIG. 5 is an electrical diagram, in schematic form, of an analog floating gate device implemented in an OTA according to another embodiment.

FIG. 5 electrically illustrates the construction of analog floating gate (AFG) device 30 as implemented according to this embodiment. AFG device 30 includes tunnel capacitor 12 and control capacitor 16, for each of which floating gate electrode FG serves as a capacitor plate similarly as in AFG device 20 described above. In this embodiment, however, AFG device 30 includes two n-channel MOS trim transistors 34, 36, for both of which floating gate electrode FG serves as a gate. It is contemplated that trim transistors 34, 36 will typically be constructed to match one another, with the same W/L ratio and the same threshold voltage. These trim transistors 34, 36 will have the same gate voltage, as established by the charge level at floating gate electrode FG.

Figure 6:
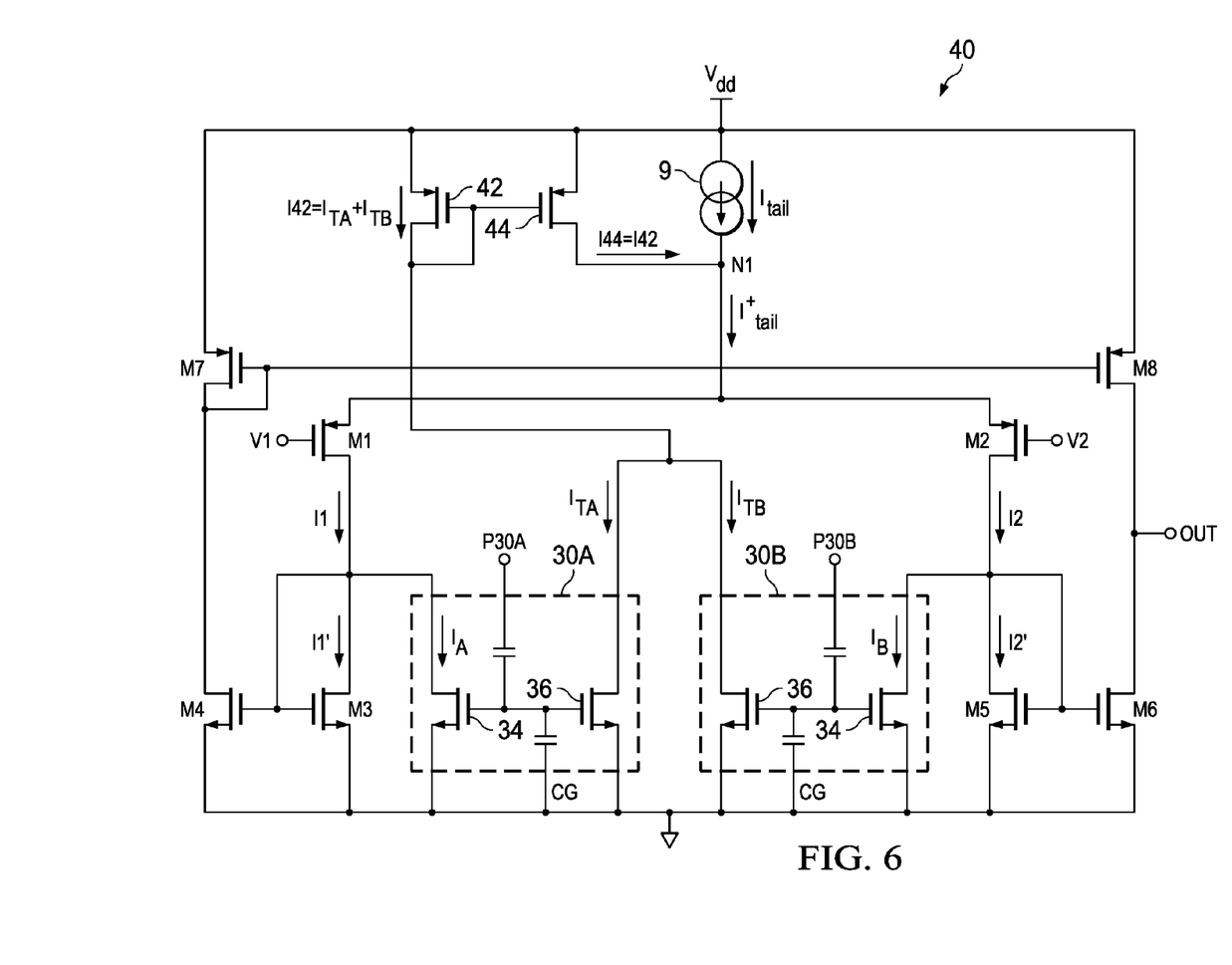
FIG. 6 is an electrical diagram, in schematic form, of an OTA constructed according to an embodiment incorporating the analog floating gate device of FIG. 5.

FIG. 6 illustrates OTA 40 constructed according to this embodiment, with those circuit elements corresponding to those also present in OTA 15 described above referred to by the same reference numerals. In this embodiment, AFG devices 30A, 30B are each an instance of AFG device 30 of FIG. 5, and as such each includes two trim transistors 34, 36. In this embodiment, trim transistor 34 of AFG device 30A has its source/drain path connected in parallel with that of series transistor M3, and trim transistor 34 of AFG device 30B has its source/drain path connected in parallel with that of series transistor M5. Control gates CG of AFG devices 30A, 30B are connected to ground, and programming nodes P30A, P30B are available for programming by analog programming circuitry 25 (not shown), as described above. As such, trim transistors 34 correspond to trim transistors 14 in the embodiment of FIG. 3, and conduct currents $I_A$, $I_B$ according to the programmed gate voltages of the corresponding AFG devices 30A, 30B, respectively, as described above.

According to this embodiment, trim transistors 36 of AFG devices 30A, 30B have their source nodes connected to ground and their drains connected together, so that the source/drain paths of the two trim transistors 36 are connected in parallel with one another. In a general sense, trim transistors 36 augment tail current $I_{tail}$ by way of currents $I_{TA}$, $I_{TB}$ that correspond to the trim currents $I_A$, $I_B$, respectively, as conducted by corresponding trim transistors 34. In the embodiment of FIG. 6, these currents $I_{TA}$, $I_{TB}$ are determined by the programmed gate voltages of the corresponding AFG devices 30A, 30B, respectively, in the same manner as currents $I_A$, $I_B$. More particularly, because trim transistors 34 and 36 share floating gate electrode FG in each of AFG devices 30A, 30B, and because the source nodes of trim transistors 34, 36 are both at ground, the programmed gate voltage that is selected for each trim transistor 34 to correct for input offset similarly determines the additional tail current to be conducted by its associated trim transistor 36. The common drain node of the two trim transistors 36 is connected to the drain and gate of p-channel MOS transistor 42, which has its source at $V_{dd}$. Transistor 42 thus conducts the sum of currents $I_{TA}$, $I_{TB}$ conducted by trim transistors 36 of AFG devices 30A, 30B. P-channel MOS transistor 44 has its source at $V_{dd}$ and its gate connected to the gate and drain of transistor 42, in current mirror fashion so as to conduct a current I44 that mirrors current I42 conducted by transistor 42. The drain of transistor 44 is connected to a node N1, which is the node at which current source 9 is connected to the two input legs, at the source nodes of input transistors M1, M2. As apparent from FIG. 6 and this description, transistors 42, 44 form a current mirror that inserts additional tail current into the input legs of OTA 40, depending on the programmed gate voltages of AFG devices 30A, 30B.

Alternatively, it is contemplated that the additional tail currents $I_{TA}$, $I_{TB}$ may be derived indirectly, while still corresponding to trim currents $I_A$, $I_B$, respectively. For example, trim transistors 36 may drive corresponding current mirrors that conduct the additional tail currents $I_{TA}$, $I_{TB}$, rather than having trim transistors 36 directly conduct those currents $I_{TA}$, $I_{TB}$ themselves. It is contemplated that these and other alternative arrangements of this embodiment will be recognized by those skilled in the art having reference to this specification.

In operation, AFG devices 30A, 30B are programmed to correct for mismatch in the two input legs, as described above relative to OTA 15 of FIG. 3. For best temperature stability, floating gate electrodes FG in both AFG devices 30A, 30B are programmed to gate voltages above the threshold voltages of trim transistors 34 and 36 in those devices. As a result, trim transistor 36 of AFG device 30A conducts a current $I_{TA}$ corresponding to the current $I_A$ conducted by its trim transistor 34, and current $I_{TB}$ conducted by trim transistor 36 of AFG device 30B corresponds to the current $I_B$ conducted by trim transistor 34 of that device. The sum of these currents $I_{TA}$, $I_{TB}$ is conducted by transistor 42 and mirrored by transistor 44 in the tail current mirror, and is added with tail current $I_{tail}$ supplied by tail current source 9 to produce summed current $I^+_{tail}$. This current $I^+_{tail}$ is the current split by the input legs into currents I1 and I2, based on the input differential voltage V1-V2 across the gates of transistors M1 and M2.

According to this embodiment, therefore, to the extent that currents $I_A$, $I_B$ are drawn by trim transistors 34 of AFG devices 30A, 30B from currents I1, I2, respectively, corresponding currents $I_{TA}$, $I_{TB}$ conducted by trim transistors 36 of AFG devices 30A, 30B are added to the tail current $I_{tail}$ from current source 9 to derive the current $I^+_{tail}$ that is applied to the input legs of OTA 40. As a result, if the correction currents $I_A$, $I_B$ are large due to a large input offset, the tail current $I^+_{tail}$ that is split by input transistors M1, M2 is increased accordingly, maintaining the currents I1', I2' as relatively independent of the magnitude of the trim currents $I_A$, $I_B$. This adaptive adjustment of the tail current improves the ability of OTA 40 to correct for input offset over temperature, avoiding nonlinearity in the offset correction, especially at higher temperatures.

In the embodiments described above, OTA 15 is constructed with p-channel MOS input transistors M1, M2, M7, M8, and n-channel MOS transistors M3 through M6, and with trim transistors 34 as n-channel devices; corresponding devices in OTA 40 are of the same channel conductivity type. Of course, it is contemplated that analog differential amplifiers such as OTAs may be constructed according to these embodiments using transistors of complementary channel conductivity types.

Figure 7:
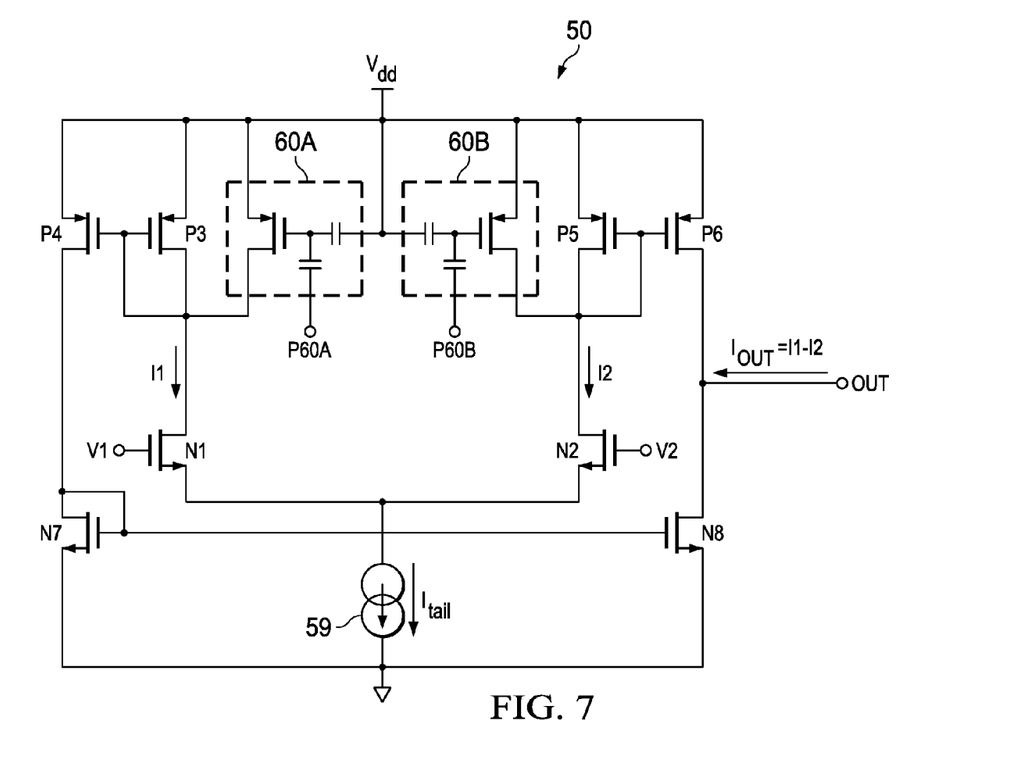
FIG. 7 is an electrical diagram, in schematic form, of an OTA constructed according to another embodiment.

FIG. 7 illustrates OTA 50 constructed according to an example of such a complementary implementation, relative to OTA 15 of FIG. 3. In this example, tail current source 59 is coupled between the input legs and ground, and drawing tail current $I_{tail}$ from the sources of input n-channel MOS transistors N1, N2, which receive input voltages V1, V2, respectively, at their gates. In the input legs, transistors N1 and N2 are each connected in series with diode-connected p-channel MOS transistors P3 and P5, respectively. The mirror leg of OTA 50 includes p-channel MOS transistor P4 with its source at $V_{dd}$ and its gate connected to the gate and drain of transistor P3 in current mirror fashion, in series with diode-connected n-channel MOS transistor N7 having its source at ground and its gate and drain coupled to the drain of transistor P4. The gate and drain of transistor P5 are connected to the gate of p-channel MOS transistor P6 in the output leg. N-channel MOS transistor N8, also in the output leg, has its drain connected to the drain of transistor P6 at terminal OUT, and its gate connected to the gate and drain of transistor N7, in current mirror fashion. The three current mirrors (P3 and P4; P5 and P6; and N7 and M8) cause the output current $I_{OUT}$ to reflect the difference in currents I1 and I2 of the input legs, in response to the differential input voltage V1-V2. Trimming of these input leg currents to correct for input offset is accomplished, in this embodiment, by AFG devices 60A, 60B, each including a p-channel MOS trim transistor connected in parallel with series transistors P3, P5, respectively, analogously to OTA 15 described above. As described above, the differential gate voltages of AFG devices 60A, 60B, as programmed, can be set to correct for input offset, for example due to mismatch in transistors N1, N2.

Of course, such a complementary construction relative to OTA 40 may be similarly used in connection with that embodiment. It is contemplated that those skilled in the art having reference to this specification can readily adapt that construction, as well as variations of these embodiments as appropriate for particular realizations, without undue experimentation.

These embodiments thus accurately correct for input offset in differential analog MOS circuits, such as the MOS OTA circuits described by way of example in this specification, and in a manner that is stable over a wide temperature range, and even for instances requiring relatively large correction. It has also been observed that these embodiments attain this input offset correction without degrading gain and phase performance over frequency, in contrast to conventional offset correction techniques that exhibit limited high frequency performance.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An analog differential circuit, comprising:
   a current source, for conducting a tail current from a first reference voltage;
   a first input leg coupled between the current source and a second reference voltage, comprising:
      a first input transistor, having a source/drain path and a gate, the gate receiving a first input voltage; and
      a first load device connected in series with the source/drain path of the first input transistor;
   a second input leg coupled between the current source and a second reference voltage, comprising:
      a second input transistor, having a source/drain path and a gate, the gate receiving a second input voltage; and
      a second load device connected in series with the source/drain path of the second input transistor;
   an output circuit, coupled to the first and second input legs, and having an output node for presenting an output signal responsive to a difference between the first and second input voltages;
   a first programmable resistive element connected in parallel with the first load device and comprising a first analog floating gate device including a first trim transistor having a source/drain path connected in parallel with the first load device and having a programmable floating gate programmed to a first gate voltage; and
   a second programmable resistive element connected in parallel with the second load device and comprising a second analog floating gate device including a second trim transistor having a source/drain path connected in parallel with the second load device and having a programmable floating gate programmed to a second gate voltage;
   wherein at least one of the gate voltages of the first and second analog floating gate devices is above the threshold voltage of its trim transistor.

2. The circuit of claim 1, wherein each of the gate voltages of the first and second analog floating gate devices is above the threshold voltage of its trim transistor.

3. The circuit of claim 2, wherein the first and second analog floating gate devices each further comprise:
   a tunnel capacitor, having a first plate coupled to a programming node, and a second plate comprising at least a part of the floating gate electrode; and
   a control capacitor, having a first plate coupled to the second reference voltage, and a second plate comprising at least a part of the floating gate electrode.

4. The circuit of claim 2, wherein the first load device comprises a first series transistor, having a source/drain path connected in series with the source/drain path of the first input transistor, and having a gate connected to its drain;
   wherein the second load device comprises a second series transistor, having a source/drain path connected in series with the source/drain path of the second input transistor, and having a gate connected to its drain;
   and wherein the output circuit comprises:
      a mirror leg, coupled between the first and second reference voltages, and coupled to the gate of the first series transistor to conduct a current mirrored with a current conducted by the first input leg responsive to the first input voltage; and
      an output mirror leg having an output node for presenting an output current corresponding to a difference of a current mirrored with the first mirror leg and a current mirrored with a current conducted by the second input leg responsive to the second input voltage.

5. The circuit of claim 4, wherein the first analog floating gate device further comprises a third trim transistor, having a source/drain path;
wherein the second analog floating gate device further comprises a fourth trim transistor, having a source/drain path;
wherein the floating gate electrode of the first analog floating gate device also serves as a gate of the third trim transistor;
wherein the floating gate electrode of the second analog floating gate device also serves as a gate of the fourth trim transistor;
and further comprising:
a tail current mirror comprising:
a first tail transistor having a source/drain path coupled between the first and second reference voltages to conduct a current corresponding to currents conducted by the third and fourth trim transistors; and
a second tail transistor having a source/drain path connected between the first reference voltage and the first and second input legs, and a gate coupled to the first tail transistor so that the second tail transistor conducts a current corresponding to the current conducted by the first tail transistor.

6. The circuit of claim 5, wherein the source/drain paths of the third and fourth trim transistors are connected in parallel;
wherein the first tail transistor has a gate connected to its drain;
wherein the gate of the second tail transistor is connected to the gate and drain of the first tail transistor;
and wherein the source/drain path of the first tail transistor is connected in series with the parallel-connected source/drain paths of the third and fourth trim transistors.

7. The circuit of claim 5, wherein the first analog floating gate device is programmed to a first gate voltage above the threshold voltage of the first and third trim transistors;
and wherein the second analog floating gate device is programmed to a second gate voltage above the threshold voltage of the second and fourth trim transistors.

8. The circuit of claim 5, wherein the first and second input transistors are p-channel metal-oxide semiconductor (MOS) transistors;
wherein the first and second series transistors, and the first and second trim transistors, are n-channel MOS transistors;
and wherein the first reference voltage is a positive power supply voltage and the second reference voltage is a ground voltage.

9. The circuit of claim 5, wherein the first and second input transistors are n-channel MOS transistors;
wherein the first and second series transistors, and the first and second trim transistors, are p-channel MOS transistors;
and wherein the first reference voltage is a ground voltage and the second reference voltage is a positive power supply voltage.

10. The circuit of claim 1, further comprising:
programming circuitry, coupled to the first and second analog floating gate devices, for programming the first and second gate voltages at a differential corresponding to an input offset of the circuit.

11. A differential amplifier circuit comprising:
a tail current source, for conducting a tail current from a first reference voltage;
a first input leg coupled between the current source and a second reference voltage, comprising:
a first input transistor, having a source/drain path and a gate, the gate receiving a first input voltage; and
a first load device connected in series with the source/drain path of the first input transistor;
a second input leg coupled in parallel with the first input leg between the current source and a second reference voltage, comprising:
a second input transistor, having a source/drain path and a gate, the gate receiving a second input voltage; and
a second load device connected in series with the source/drain path of the second input transistor;
an output circuit, coupled to the first and second input legs, for presenting an output corresponding to a difference between the first and second input voltages;
a first analog floating gate device, comprising:
a floating gate electrode;
a tunnel capacitor, having a plate coupled to a programming node and capacitively coupled to the floating gate electrode;
a first trim transistor, having a source/drain path connected in parallel with the first load device, the floating gate electrode serving as a gate of the first trim transistor; and
a second trim transistor, having a source/drain path, the floating gate electrode serving as a gate of the second trim transistor;
a second analog floating gate device, comprising:
a floating gate electrode;
a tunnel capacitor, having a plate coupled to a programming node and capacitively coupled to the floating gate electrode;
a third trim transistor, having a source/drain path connected in parallel with the second load device, the floating gate electrode serving as a gate of the third trim transistor; and
a fourth trim transistor, having a source/drain path, the floating gate electrode serving as a gate of the fourth trim transistor; and
a tail current mirror comprising:
a first tail transistor having a source/drain path coupled between the first and second reference voltages so as to conduct a current corresponding to currents conducted by the second and fourth trim transistors; and
a second tail transistor having a source/drain path connected between the first reference voltage and the first and second input legs, and a gate coupled to the first tail transistor so that the second tail transistor conducts a current corresponding to the current conducted by the first tail transistor.

12. The circuit of claim 11, wherein the floating gate of the first analog floating gate device is programmed to a first gate voltage above the threshold voltages of the first and second trim transistors;
and wherein the floating gate of the second analog floating gate device is programmed to a second gate voltage above the threshold voltages of the third and fourth trim transistors.

13. The circuit of claim 11, wherein the first and second analog floating gate devices each further comprise:

a control capacitor, having a plate coupled to the second reference voltage and capacitively coupled to the floating gate electrode.

14. The circuit of claim 11, wherein the source/drain paths of the second and fourth trim transistors are connected in parallel;
wherein the first tail transistor has a gate connected to its drain;
wherein the gate of the second tail transistor is connected to the gate and drain of the first tail transistor;
and wherein the source/drain path of the first tail transistor is connected in series with the parallel-connected source/drain paths of the second and fourth trim transistors between the first and second reference voltages.

15. The circuit of claim 11, wherein the first load device comprises a first series transistor, having a source/drain path connected in series with the source/drain path of the first input transistor, and having a gate connected to its drain;
wherein the second load device comprises a second series transistor, having a source/drain path connected in series with the source/drain path of the second input transistor, and having a gate connected to its drain;
and wherein the output circuit comprises:
a mirror leg, coupled between the first and second reference voltages, and coupled to the gate of the first series transistor to conduct a current mirrored with a current conducted by the first input leg responsive to the first input voltage; and
an output leg comprising:
a first output transistor having a source/drain path coupled to the first reference voltage, and a gate coupled to the mirror leg; and
a second output transistor, having a source/drain path coupled between the source/drain path of the first output transistor at an output node and the second reference voltage, and having a gate coupled to the gate and drain of the second series transistor.

16. The circuit of claim 11, wherein the first and second input transistors are p-channel metal-oxide semiconductor (MOS) transistors;
wherein the first and second series transistors, and the first, second, third, and fourth trim transistors, are n-channel MOS transistors;
and wherein the first reference voltage is a positive power supply voltage and the second reference voltage is a ground voltage.

17. The circuit of claim 11, wherein the first and second input transistors are n-channel MOS transistors;
wherein the first and second series transistors, and the first, second, third, and fourth trim transistors, are p-channel MOS transistors;
and wherein the first reference voltage is a ground voltage and the second reference voltage is a positive power supply voltage.

18. A method of trimming an analog differential circuit, the analog differential circuit comprising first and second input legs that each include an input transistor with a gate receiving an input voltage, in series with a load device, a current source producing a tail current applied to the first and second input legs arranged in parallel, and an output circuit presenting an output level responsive to a difference between the input voltages received by the first and second input legs, the method comprising:
measuring an input offset corresponding to the output level with zero differential in the input voltages applied to the first and second input legs;
programming a floating gate electrode of a first trim transistor to a first gate voltage, the first trim transistor having a source/drain path connected in parallel with the load device of the first input leg; and
programming a floating gate electrode of a second trim transistor to a second gate voltage, the second trim transistor having a source/drain path connected in parallel with the load device of the second input leg, and the second gate voltage differing from the first gate voltage by an amount corresponding to the measured input offset;
wherein at least one of the first and second gate voltages is above the threshold voltage of its trim transistor.

19. The method of claim 18, wherein the first gate voltage is above the threshold voltage of the first trim transistor and the second gate voltage is above the threshold voltage of the second trim transistor.

20. The method of claim 18, wherein the analog differential circuit further comprises a current source producing a tail current that is split between the first and second input legs responsive to the difference between the input voltages, and a tail current mirror connected in parallel with the current source;
wherein the floating gate electrode of the first trim transistor is shared by a third trim transistor having a source/drain path connected in series with a first leg of the tail current mirror;
wherein the floating gate electrode of the second trim transistor is shared by a fourth trim transistor having a source/drain path in parallel with the source/drain path of the third trim transistor and connected in series with the first leg of the tail current mirror.

21. The method of claim 20, wherein the first gate voltage is above the threshold voltage of the first and third trim transistors and the second gate voltage is above the threshold voltage of the second and fourth trim transistors.

* * * * *